US009166271B2

(12) United States Patent
Peroulis et al.

(10) Patent No.: US 9,166,271 B2

(45) Date of Patent: Oct. 20, 2015

(54) TUNABLE CAVITY RESONATOR INCLUDING A PLURALITY OF MEMS BEAMS

(71) Applicant: Purdue Research Foundation, West Lafayette, IN (US)

(72) Inventors: Dimitrios Peroulis, West Lafayette, IN (US); Adam Fruehling, West Lafayette, IN (US); Joshua Azariah Small, Lexington Park, MD (US); Xiaoguang Liu, West Lafayette, IN (US); Wasim Irshad, West Lafayette, IN (US); Muhammad Shoaib Arif, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 2 days.

(21) Appl. No.: 13/908,201

(22) Filed: Jun. 3, 2013

(65) Prior Publication Data

US 2014/0203896 A1 Jul. 24, 2014

Related U.S. Application Data

(60) Provisional application No. 61/654,480, filed on Jun. 1, 2012, provisional application No. 61/654,497, filed on Jun. 1, 2012, provisional application No. 61/654,615, filed on Jun. 1, 2012.

(51) Int. Cl.

| | |
|---|---|
| ***H01P 5/08*** | (2006.01) |
| ***H03H 7/38*** | (2006.01) |
| ***H01P 7/06*** | (2006.01) |

(52) U.S. Cl.

CPC .................................... *H01P 7/065* (2013.01)

(58) Field of Classification Search

USPC ................................ 333/17.3; 455/39, 198.1

See application file for complete search history.

(56) References Cited

U.S. PATENT DOCUMENTS

| | | | | |
|---|---|---|---|---|
| 2011/0049649 | A1* | 3/2011 | Anderson et al. | 257/415 |
| 2011/0314669 | A1* | 12/2011 | Stamper et al. | 29/846 |
| 2012/0319528 | A1* | 12/2012 | Jahnes et al. | 310/300 |
| 2013/0168782 | A1* | 7/2013 | Jahnes et al. | 257/415 |
| 2013/0278359 | A1* | 10/2013 | Stephanou et al. | 333/232 |
| 2013/0278609 | A1* | 10/2013 | Stephanou et al. | 345/501 |
| 2013/0278998 | A1* | 10/2013 | Stephanou et al. | 359/346 |
| 2013/0335173 | A1* | 12/2013 | Peroulis et al. | 333/231 |
| 2014/0203896 | A1* | 7/2014 | Peroulis et al. | 333/232 |

(Continued)

OTHER PUBLICATIONS

Bouchaud, Jeremie, "Propelled by HP Inkjet Sales, STMicroelectronics Remains Top MEMS Foundry," IHS Technology, Jul. 5, 2011 Press Release (2 pgs).

(Continued)

*Primary Examiner* — Adam Houston

(74) *Attorney, Agent, or Firm* — Maginot, Moore & Beck LLP

(57) ABSTRACT

A tunable cavity resonator includes a substrate, a cap structure, and a tuning assembly. The cap structure extends from the substrate, and at least one of the substrate and the cap structure defines a resonator cavity. The tuning assembly is positioned at least partially within the resonator cavity. The tuning assembly includes a plurality of fixed-fixed MEMS beams configured for controllable movement relative to the substrate between an activated position and a deactivated position in order to tune a resonant frequency of the tunable cavity resonator.

20 Claims, 15 Drawing Sheets

(56) References Cited

U.S. PATENT DOCUMENTS

| | | | | |
|---|---|---|---|---|
| 2014/0308771 | A1* | 10/2014 | Brigham et al. | 438/51 |
| 2014/0332913 | A1* | 11/2014 | Stamper | 257/418 |
| 2015/0041932 | A1* | 2/2015 | Herrin et al. | 257/418 |

OTHER PUBLICATIONS

"The Future of Cinema Has Arrived: More Than 50,000 Theatre Screens Worldwide Feature The Brightest, 2D/3D Digital Cinema Experience With DLP Cinema®," Dec. 7, 2011 (4 pgs).
"Knowles Ships 2 Billionth SiSonic™ MEMS Microphone," May 20, 2011 (3 pgs).
"Koobe, Taiwan's Leading E-Reader Manufacturer, and Qualcomm Bring Mirasol Display Technology To Taiwan in Next-Generation E-Reader," Jan. 30, 2012 (2 pgs).
"MEMtronics Captures Prestigious R&D 100 Award," Press Release (7 pgs).
"Omron Releases New RF MEMS Switch With Superior High Frequency Characteristics Rated to 100 Million Operations," (8 pgs).
Rosa, Michael A., et al., "A Novel External Electrode Configuration for the Electrostatic Actuation of MEMS Based Devices," Journal of Micromechanics and Microengineering 14 (2004) 446-451 (9 pgs).
Rottenbert, X., et al., "An Electrostatic Fringing-Field Actuator (EFFA): Application Towards a Low-Complexity Thin-Film RF-MEMS Technology," Journal of Micromechanics and Microengineering 17 (2007) S204-S210 (8 pgs).
Allen, Wesley N., et al., "Bandwidth-optimal Single Shunt-Capacitor Matching Networks For Parallel RC Load of Q>1," IEEE 2009 (11 pgs).
Small, Joshua, et al., "Electcrostatically Tunable Analog Single Crystal Silicon Fringing-Field MEMS Varactors," IEEE 2009 (4 pgs).
Liu, Xiaoguang, et al., "Impact of Mechanical Vibration on the Performance of RF MEMS Evanescent-Mode Tunable Resonators," IEEE Microwave and Wireless Components Letters, vol. 21, No. 8, Aug. 2011 (3 pgs).
Su, Jie, "A Lateral-Drive Method To Address Pull-In Failure In MEMS," A Dissertation, Feb. 2008 (101 pgs).
Scott, Sean and Peroulis, Dimitrios, "A Capacitively-Loaded MEMS Slot Element for Wireless Temperature Sensing of Up to 300°C," IEEE 2009 (4 pgs).
Scott, Sean, et al., "An Inherently-Robust 300°C MEMS Temperature Sensor for Wireless Health Monitoring of Ball and Rolling Element Bearings," IEEE 2009 (4 pgs).
Lee, Ki Bang, "Non-Contact Electrostatic Microactuator Using Slit Structures: Theory and A Preliminary Test," Journal of Micromechanics and Microengineering 17 (2007) 2186-2196 (12 pgs).
Su, J, et al., "A Surface Micromachined Offset-Drive Method to Extend the Electrostatic travel Range," Journal of Micromechanics and Microengineering 20 (1010) 0150004 (11 pgs).
Baek, Chang-Wook, et al., "Measurement of the Mechanical Properties of Electroplated Gold Thin Films Using Micromachined Beam Structures," Sensors and Actuators A 117 (2005) 17-27 (11 pgs).
Elata, David and Bamberger, Hagay, "On the Dynamic Pull-In of Electrostatic Actuators With Multiple Degress of Freedom and Multiple Voltage Sources," Journal of Microelectromechanical Systems, vol. 15, No. 1, Feb. 2006 (10 pgs).
Ou, Kuang-Shun, et al., "Fast Positioning and impact Minimizing of MEMS Devices by Suppression of Motion-Induces Vibration by Command-Shaping Method," Journal of Microelectromechanical Systems, vol. 20, No. 1, Feb. 2011 (12 pgs).
Chen, Kuo-Shen, et al., "Residual Vibration Suppression for Duffing Nonlinear Systems with Electromagnetical Actuation Using Nonlinear Command Shaping Techniques," ASMA 2006, vol. 128, Dec. 2006 (12 pgs).
Garg, Anurag, et al., "Impact of Sacrificial Layer Type on Thin-Film Metal Residual Stress," IEEE Sensors 2009 Conference, (4 pgs).
"Welcome to the World of LEXT 3D," Olympus brochure (16 pgs).
Leus, Vitaly and Elata, David, "Fringing Field Effect in Electrostatic Actuators," Technical Report ETR-2004-2 May 2004, (19 pgs).
Pamidighantam, Sayanu, et al., "Pull-In Voltage Analysis of Electrostatically Actuated Beam Structures With Fixed-Fixed and Fixed-Free End Conditions," J. Micromech. Microeng. 12 (2002) 458-464 (8 pgs).
Meijs, N. P. van der, "VLSI Circuit Reconstruction From Mask Topology," VLSI Journal 2 (1984) 85-119 (35 pgs).
Park, Sang-June, et al, "High-Q RF-MEMS Tunable Evanescent-Mode Cavity Filter," IEEE 2009 (4 pgs).
Small, Joshua, et al., "A Fast High-Q X-Band RF-MEMS Reconfigurable Evanescent-Mode Cavity Resonator," IEEE 2012 (3 pgs).
Joshi, Himanshu, et al., "Highly Loaded Evanescent Cavities For Widely Tunable High-Q Filters," IEEE 2007 (4 pgs).
Joshi, Himanshu, et al., "High-Q Fully Reconfigurable Tunable Bandpass Filters," IEEE Transactions on Microwave Theory and Techniques, Vol. 57, No. 12, Dec. 2009 (9 pgs).
Joshi, Himanshu, et al., "High Q Narrow-Band Tunable Filters With Controllable Bandwidth," IMS 2009 (4 pgs).
Moon, Sungwook, et al., "Substrate Integrated Evanescent-Mode Cavity Filter With a 3.5 to 1 Tuning Radio," IEEE Microwave and Wireless Components Letters, vol. 20, No. 8, Aug. 2010 (3 pgs).
Rebeiz, Gabriel M., et al., "Tuning in to RF MEMS," IEEE Microwave Magazine, Oct. 2009 (18 pgs).
Park, Sang-Jun., et al., "High-Q RF-MEMB 4-6-GHz Tunable Evanescent-Mode Cavity Filter," IEEE Transactions on Microwave Theory and Techniques, vol. 58, No. 2, Feb. 2010 (9 pgs).
Liu, Xiaoguang, et al., "High-Q Tunable Microwave Cavity Resonators and Filters Using 501-Based Rf Mems Tuners," Journal of Microelectromechanical Systems, vol. 19, No. 4, Aug. 2010 (11 pgs).
Liu, Xiaoguang, et al., " a 3.4 - 6.2 GHz Continuously Tunable Electrostatic Mems Resonator With Quality Factor of 460-530," Ims 2009 (4 pgs).
Irshad, Wasim and Peroulis, Dimitrios, "A 12-18 GHz Electrostatically Tunable Liquid Metal Rf Mems Resonator with Quality Factor of 1400-1840," IEEE 2011 (4 pgs).
Arif, Muhammad Shoaib, et al., "A High-Q Magnetostatically-Tunable All-Silicon Evanescent Cavity Resonator," IEEE 2011 (4 pgs).
Arif, Muhammad Shoaib and Peroulis, Dimitrios, " a 6 to 24 GHz Continuously Tunable, Microfabricated, High-Q Cavity Resonator With Electrostatic Mems Actuation," (3 pgs). No Date.
Stefanini, Romain, et al., "Ku Band High-Q Tunable Surface-Mounted Cavity Resonator Using Rf Mems Varactors," IEEE Microwave and Wireless Components Letters, vol. 21, No. 5, May 2011 (3 pgs).
Josh!, Himanshu, et al., "High Q Narrow-Band Tunable Filters with Controllable Bandwidth," Ims 2009 (4 pgs).
Gong, Songbin, et al., "A Temperature Insensitive Dc-Contact Rf-Mems Switch," Proceedings of the 40th European Microwave Conference, Sep. 28-30, 2010 (4 pgs).
Patel, Chirag D., and Rebeiz, Gabriel M., "A High Power (>5 W) Temperature Stable Rf Mems Metal-Contact Switch with Orthogonal Anchors and Force-Enhancing Stoppers," IEEE 2011 (4 pgs).
Park, Sang-Jun., et al., "Low-Loss 4-6-GHz Tunable Filter With 3-Bit High-Q Orthogonal Bias Rf-Mems Capacitance Network," Iee Transactions on Microwave Theory and Techniques, vol. 56, No. 10, Oct. 2008, (8 pgs).
Hung, Elmer S. And Senturia, Stephen D., "Extending the Travel Range of Analog-Tuned Electrostatic Actuators," Journal of Microelectromechanical Systems, vol. 8, No. 4, Dec. 1999 (9 pgs).

* cited by examiner

TUNABLE CAVITY RESONATOR INCLUDING A PLURALITY OF MEMS BEAMS

This application claims the benefit of priority of U.S. provisional application Ser. No. 61/654,480, filed Jun. 1, 2012; U.S. provisional application Ser. No. 61/654,497, filed Jun. 1, 2012; and U.S. provisional application Ser. No. 61/654,615, filed Jun. 1, 2012, the disclosures of which are incorporated by reference herein in their entireties.

This invention was made with government support under W15P7T-10-C-B019 awarded by the Defense Advanced Research Projects Agency ("DARPA") and DE-FC52-08NA28617 awarded by the National Nuclear Security Administration of the U.S. Department of Energy. The government has certain rights in the invention.

FIELD

The present disclosure relates to cavity resonators for electromagnetic signals and, in particular, to a tunable cavity resonator that includes a tuning assembly having a plurality of MEMS beams, the movement of which tunes a resonant frequency of the cavity resonator.

BACKGROUND

Tunable cavity resonators are electronic components that are useable as filters for radio frequency electromagnetic signals, among other types of signals. In particular, tunable cavity resonators using the evanescent mode cavity-based implementation are effective filters that are low-loss and widely tunable. Additionally, cavity resonators using the evanescent mode implementation typically offer a good balance between filter size, signal loss, spurious-free dynamic range, and tuning range.

Tunable cavity resonators typically include either a piezoelectric tuning device or an electrostatic microelectromechanical systems ("MEMS") diaphragm tuning device. Piezoelectrically-tuned cavity resonators typically yield excellent radio frequency filtering results. These types of tuning devices, however, are typically large, with a diameter of approximately twelve to thirteen millimeters, and have slow response speeds that are on the order of one millisecond or more. MEMS diaphragms also typically yield excellent radio frequency filtering results, but have a low unloaded quality factor ("$Q_u$") due to effects from the biasing network that is used to control the MEMS diaphragm. Accordingly, known tuning devices for cavity resonators exhibit a tradeoff between size, unloaded quality factor, frequency tuning, and tuning speed.

Accordingly, further developments based on one or more of the above-described limitations are desirable for tunable cavity resonators.

SUMMARY

According to one embodiment of the disclosure, a tunable cavity resonator includes a substrate, a cap structure, and a tuning assembly. The cap structure extends from the substrate, and at least one of the substrate and the cap structure defines a resonator cavity. The tuning assembly is positioned at least partially within the resonator cavity. The tuning assembly includes a plurality of fixed-fixed MEMS beams configured for controllable movement relative to the substrate between an activated position and a deactivated position in order to tune a resonant frequency of the tunable cavity resonator.

According to another embodiment of the disclosure, a tunable cavity resonator includes a substrate, a cap structure, a tuning assembly, and a DC biasing network. The cap structure extends from the substrate, and at least one of the substrate and the cap structure defines a resonator cavity. The tuning assembly is positioned at least partially within the resonator cavity. The tuning assembly includes a plurality of fixed-fixed MEMS beams configured for controllable movement relative to the substrate and a plurality of actuators. Each actuator of the plurality of actuators is configured to controllably cause movement of one of the fixed-fixed MEMS beams of the plurality of fixed-fixed MEMS beams. The DC biasing network is configured to generate a dynamic activation signal for activating at least one fixed-fixed MEMS beam of the plurality of fixed-fixed MEMS beams. In response to a unit step activation signal, the at least one fixed-fixed MEMS beam is moved from an initial position to a peak position in a peak time period. The dynamic activation signal includes a rise time portion in which a magnitude of the activation signal is increased from an initial value, to a first intermediate value, and then to a peak value. The rise time portion is started in response to the generation of the dynamic activation signal and ends in response to the dynamic activation signal having the peak value. The dynamic activation signal is maintained at the first intermediate value for a first predetermined time period. A duration of the rise time portion is greater than a duration of the peak time period. A plurality of electrostatic spaces is defined between each fixed-fixed MEMS beam of the plurality of fixed-fixed MEMS beams and the substrate. Each actuator of the plurality of actuators is spaced apart from the plurality of electrostatic spaces.

According to yet another embodiment of the disclosure, a method of tuning a tunable cavity resonator is disclosed. The tunable cavity resonator includes a plurality of MEMS beams and a DC biasing network electrically coupled to the plurality of MEMS beams. The DC biasing network is configured to generate a dynamic activation signal for controllably moving at least one of the MEMS beams between an activated position and an initial position. The method includes increasing a voltage magnitude of the dynamic activation signal from an initial value to a peak value during a rise-time time period. The rise-time time period ends in response to the voltage magnitude being the peak value. The method further includes causing at least one MEMS beam to move from the initial position to the activated position in response to increasing the voltage magnitude of the dynamic activation signal. The at least one MEMS beam is in the activated position at the end of the rise-time time period. In response to a unit step activation signal the at least one MEMS beam is moved from an initial position to a peak position in a peak time period. A duration of the rise time portion is greater than a duration of the peak time period. A magnitude of the peak position is greater than a magnitude of the activated position.

DETAILED DESCRIPTION

Figure 1:
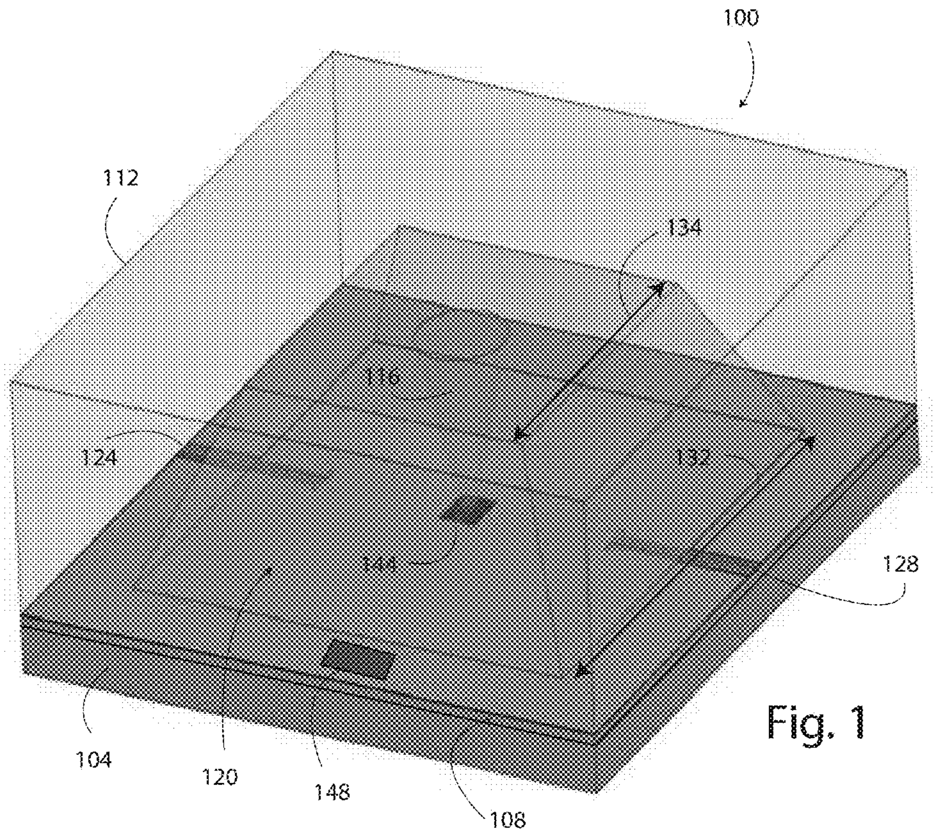
FIG. 1 is a perspective view of a tunable cavity resonator as described herein.
Figure 2:
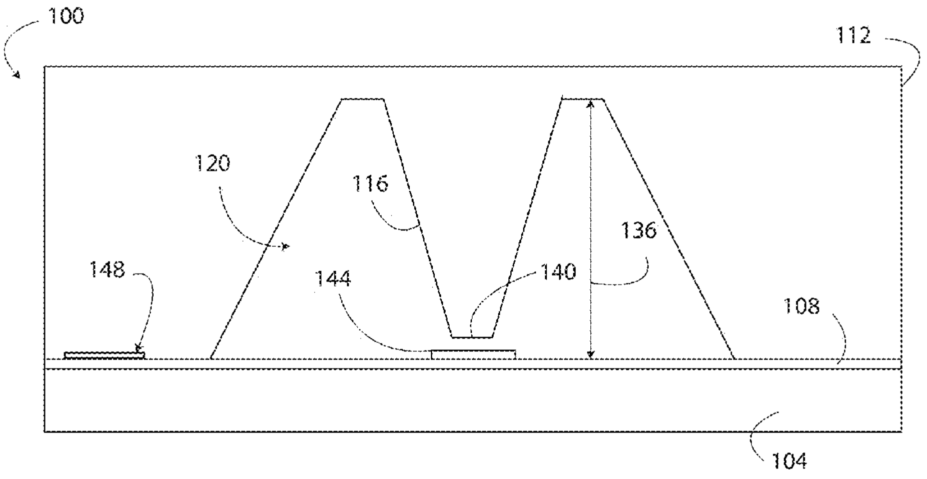
FIG. 2 is a cross sectional view of the cavity resonator of FIG. 1.

As shown in FIGS. 1 and 2, a tunable cavity resonator 100 includes a substrate 104, an insulating structure 108, and a cap structure 112. The substrate 104 is formed from high resistivity silicon. In one embodiment, the substrate 104 has a resistance of approximately 10 kΩ/cm and has a thickness of approximately 525 micrometers.

The insulating structure 108 is formed on the substrate 104 and is positioned between the substrate 104 and the cap structure 112. The insulating structure 108 is formed from an electrical insulator. For example, the insulating structure 108 is formed from thermally grown silicon dioxide.

The cap structure 112 extends from the substrate 104 and the insulating structure 108. The cap structure 112 is also formed from silicon. The cap structure 112 defines an evanescent post 116 and a resonator cavity 120 in which an input lead 124 (FIG. 1) and an output lead 128 (FIG. 1) are positioned. The input lead 124 and the output lead 128 are provided, in at least one embodiment, as shorted coplanar waveguide ("CPW") transmission lines.

The resonator cavity 120 defines a lower edge length 132 (FIG. 1) of approximately six millimeters, an upper edge length 134 (FIG. 1) of approximately 3.6 millimeters, and a height 136 (FIG. 2) of approximately 1.5 millimeters. The resonator cavity 120 is an all-silicon resonator cavity. Accordingly, the portion of the cavity resonator 100 that defines the resonator cavity 120 is formed completely from silicon or is formed substantially from silicon. The volume and shape of the resonator cavity 120 contributes to establishing a resonate frequency of the cavity resonator 100. In some embodiments, the resonator cavity 120 is at least partially defined by the substrate 104 and insulating structure 108. For example, the substrate 104 and the insulating structure 108 may define a depression or a plateau (not shown) that at least partially defines the resonator cavity 120. Additionally, the resonator cavity 120, in some embodiments, is lined with a conductive material, such as gold.

As shown in FIG. 2, the evanescent post 116 extends from the cap structure 112 toward the substrate 104. The evanescent post 116 has a generally frustoconical shape, with the smaller surface of the evanescent post defining a capacitive surface 140.

With reference to FIG. 1, the cavity resonator 100 further includes a tuning assembly 144 and a DC biasing network 148. The tuning assembly 144 is at least partially positioned within the resonator cavity 120 and includes a plurality of fixed-fixed MEMS beams 152 (FIG. 3) and an actuator assembly 156 (FIG. 4). The MEMS beams 152 are formed from gold 174 (FIG. 6D) deposited onto the insulating structure 108.

Figure 3:
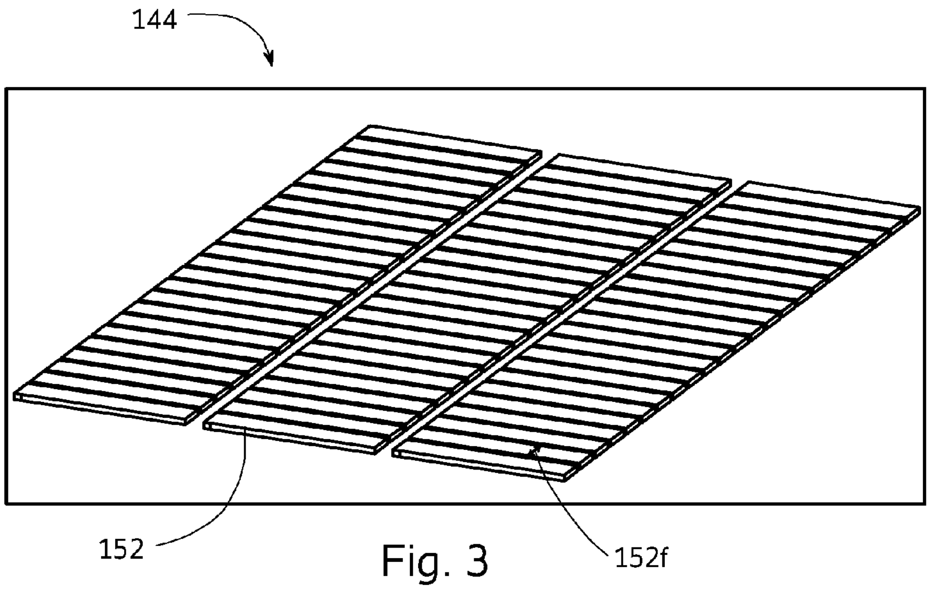
FIG. 3 is a perspective view of an array of fixed-fixed MEMS beams of the cavity resonator of FIG. 1.
Figure 4:
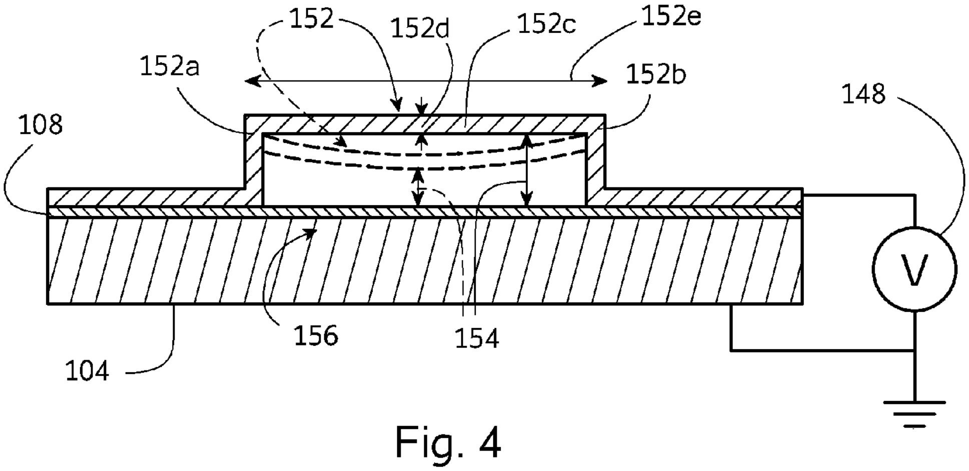
FIG. 4 is a cross sectional view of a portion of the cavity resonator of FIG. 1, showing one of the fixed-fixed MEMS beams of FIG. 3 in a deactivated position (solid lines) and in an activated position (broken lines)

As shown in FIGS. 3 and 4, the MEMS beams 152 are positioned in a rectangular array on top of the insulating structure 108. The tuning assembly 144 includes approximately seventy-five of the MEMS beams 152 in the array. In another embodiment, the tuning assembly 144 includes between ten to two hundred of the MEMS beams 152 in the array. Also in another embodiment, the MEMS beams 152 are positioned in an array of another shape including, for example, a circular array.

With reference to FIG. 4, each of the MEMS beams 152 includes a fixed end 152*a*, an opposite fixed end 152*b*, and a flexible central portion 152*c* disposed therebetween. The MEMS beams 152 are referred to as "fixed-fixed" since both ends 152*a*, 152*b* of the beams have a fixed position relative to the substrate 104. The flexible central portion 152*c* is movable to a desired position relative to the substrate 104 in response to the tuning structure receiving a DC activation signal. The central portion 152*c* defines a thickness 152*d* and a length 152*e* of the MEMS beam 152. In FIG. 3, the central portion 152*c* also defines a width 152*f* of the MEMS beam 152. An exemplary MEMS beam 152 has a thickness 152*d* of 0.9 micrometers, a length 152*e* of 185 micrometers, and a width 152*f* of 20 micrometers.

With reference still to FIG. 4, the MEMS beams 152 are configured for controllable movement between a deactivated position (solid lines) and an activated position (broken lines), in order to tune a resonate frequency of the cavity resonator 100, as described below. In the activated position the central portion 152*c* is biased toward the substrate 104 and the insulating structure 108. In particular, a distance between the central portion 152*c* and the insulating structure 108 is referred to as a gap height 154. Changing a position of a MEMS beam 152 refers to changing the gap height 154 of the central portion 152*c*.

The actuator assembly 156 is configured to controllably cause movement the MEMS beams 152. As shown in the embodiment of FIG. 4, the actuator assembly 156 is at least a portion of the substrate 104. Accordingly, the MEMS beams 152 of FIGS. 3 and 4 are configured for direct electrostatic activation as opposed to a fringe-field electrostatic activation. The MEMS beams 152 are also referred to as being "substrate biased," in this embodiment.

As shown in FIGS. 1 and 2, the DC biasing network 148 is electrically connected to the tuning assembly 144. In particular, the DC biasing network 148 is connected to the insulating layer 108 and is electrically coupled to the layer of gold 174 that forms the MEMS beams 152. The layer of gold 174 extends from inside of the resonator cavity 120 to outside of the resonator cavity. As shown in FIG. 1, the DC biasing network 148 is spaced apart from the resonator cavity 120 so that the DC biasing network does not electrically interfere with the electrical characteristic of the cavity resonator 100.

Figure 5A:
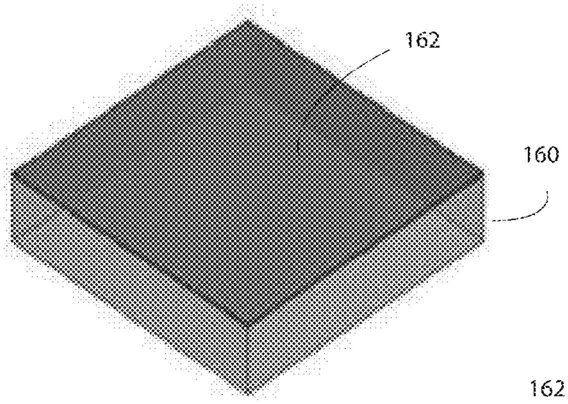
FIG. 5A is a perspective view of a cap structure of the cavity resonator of FIG. 1, showing the cap structure during a first stage of a forming process.
Figure 5B:
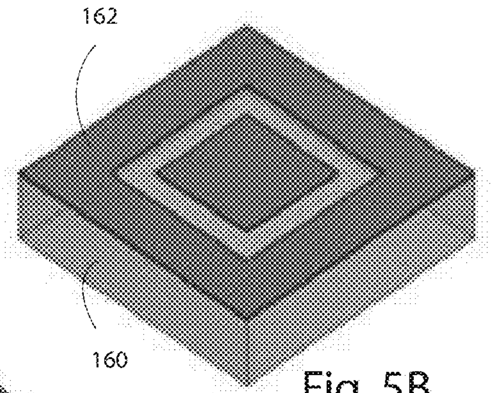
FIG. 5B is a perspective view of the cap structure shown during a second stage of the forming process.
Figure 5C:
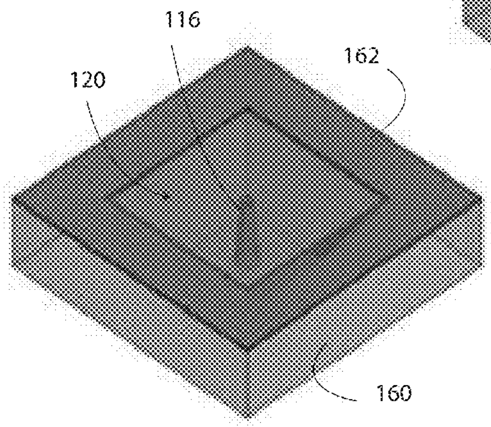
FIG. 5C is a perspective view of the cap structure shown during a third stage of the forming process.
Figure 5D:
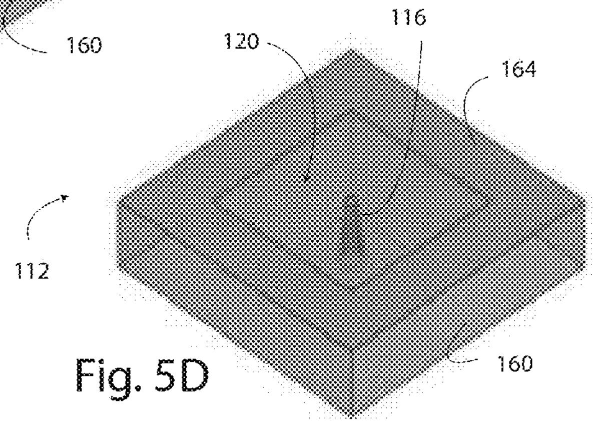
FIG. 5D is a perspective view of the cap structure shown during a fourth stage of the forming process.

FIGS. 5A through 5D, illustrate a process for forming the cap structure 112. As shown in FIG. 5A, first a two millimeter thick high-resistivity silicon wafer 160 is coated with three hundred nanometers of silicon nitride 162 using low-pressure chemical vapor deposition ("LPCVD"). In FIG. 5B, the silicon nitride 162 is patterned through dry-etching with $SF_6$ in a reactive ion etcher. The silicon nitride 162 serves as a wet etch mask for the subsequent silicon etch. Next in FIG. 5C, the silicon nitride 162 is wet etched approximately 1.5 millimeters deep in a 45% potassium hydroxide ("KOH") by volume solution maintained at approximately eighty degrees Celsius. The wet etching forms the resonator cavity 120 and leaves behind the evanescent post 116. The etch rate is approximately fifty five micrometers per hour. In FIG. 5D, the cavity 120 is flood sputter deposited with approximately two micrometers of gold 164.

Figure 6A:
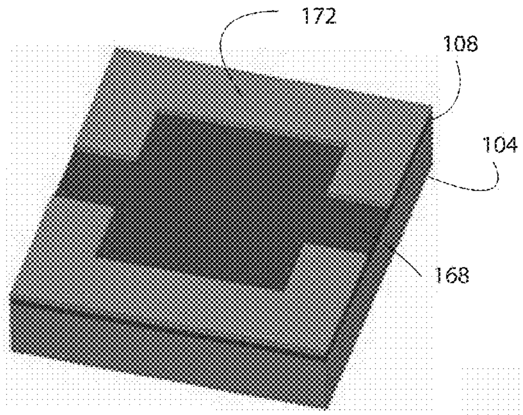
FIG. 6A is a perspective view of the substrate of the cavity resonator of FIG. 1, shown during a first stage of a forming process for forming the tuning structure.

As shown in FIG. 6A, fabrication of the MEMS beams 152 begins with spin coating and patterning an approximately twenty micrometer thick AZ9260 photoresist layer 168 (or the like) on the insulating structure 108. The photoresist layer 168 serves as a liftoff layer for copper. Next, copper and a thin titanium adhesion layer 172 (less than approximately twenty nanometers) are flood-deposited on the liftoff mold to a thickness of approximately seven micrometers. To facilitate the liftoff process, the sample is placed in an ultrasonic cleaner with acetone.

Figure 6B:
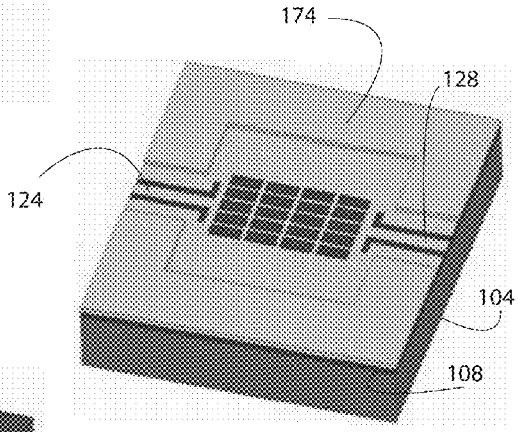
FIG. 6B is a perspective view of the substrate shown during a second stage of the forming process.

Next as shown in FIG. 6B, a gold layer 174, approximately two micrometers thick, is flood-deposited and patterned to form the input lead 124 and the output lead 128 and anchor points (not shown) which permit DC biasing between the MEMS beams 152 and the silicon substrate 104. A very thin (less than approximately twenty nanometers) titanium adhesion layer (not shown) is also included.

Figure 6C:
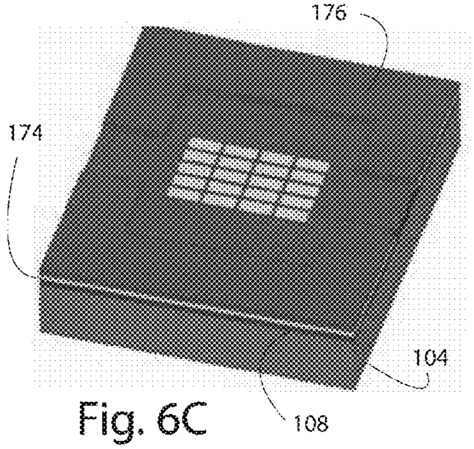
FIG. 6C is a perspective view of the substrate shown during a third stage of the forming process.

In FIG. 6C, a four micrometer thick SC1827 photoresist sacrificial layer 176 is coated and patterned to define the array of MEMS beams 152. Gold is again flood deposited to one micrometer thick and patterned for the MEMS beams 152. Again, a very thin (less than approximately twenty nanometers) titanium adhesion layer (not shown) is also included.

Figure 6D:
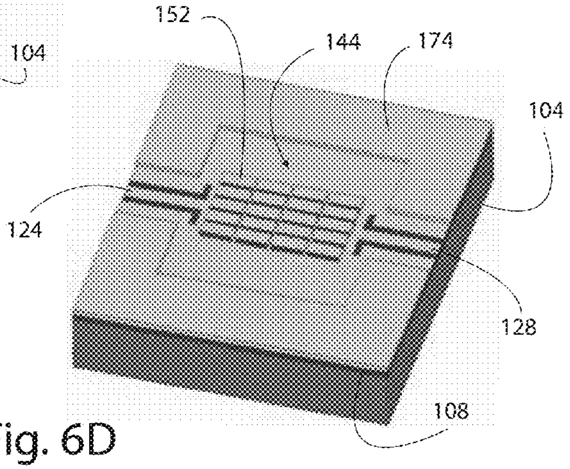
FIG. 6D is a perspective view of the substrate shown during a fourth stage of the forming process.

As shown in FIG. 6D, the MEMS beams 152 are released in a standard photoresist stripper, and the substrate 104 with MEMS beams 152 is dried in a carbon dioxide critical point dryer.

In operation, the cavity resonator 100 functions similarly to a bandpass filter by intensifying a range of frequencies of an input radio frequency electromagnetic signal. The range of frequencies that is intensified is centered about the resonate frequency of the cavity resonator. In order to intensify a different range of frequencies, the cavity resonator 100 is tuned using the tuning assembly 144, which changes the resonate frequency of the cavity resonator 100.

The tuning assembly 144 tunes the resonate frequency of the cavity resonator 100 by changing a capacitance that is exhibited between the tuning assembly and the capacitive surface 140 of the evanescent post 116. The capacitance is changed by moving the MEMS beams 152 either closer or farther from the capacitive surface 140. Moving the MEMS beams 152 relative to the capacitive surface 140 has a similar effect as changing the distance between the plates of a parallel plate capacitor that uses air as a dielectric.

The MEMS beams 152 are moved by generating an DC activation signal with the DC biasing network 148. The activation signal establishes a potential difference between the MEMS beams 152 and the substrate 104. The potential difference results in an electric field that pulls the MEMS beams 152 toward the substrate 104 or that pushes the MEMS beam away from the substrate. Thus, the DC biasing network 148 is said to "electrostatically" bias the MEMS beams 152 relative to the substrate 104 to a desired gap height (i.e. position). By selecting a particular DC voltage level, the DC biasing network 148 accurately controls the position of the MEMS beams 152 within a range of desired gap heights.

Figure 7:
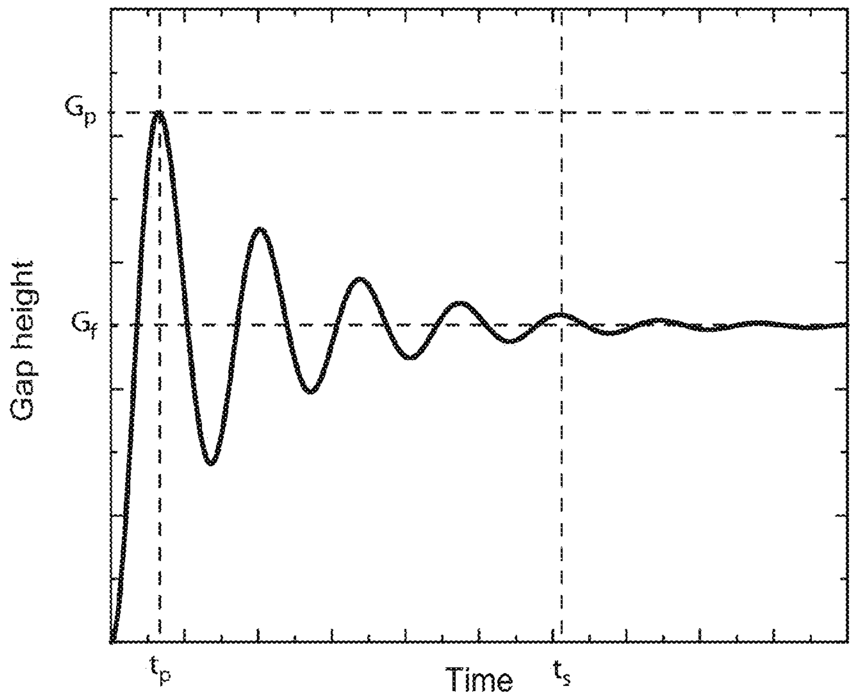
FIG. 7 is a graph showing an under-damped second order response of one of the MEMS beams of the cavity resonator of FIG. 1, the illustrated response occurs in response to a unit step activation signal.

As shown in FIG. 7, the position response of one of the MEMS beams 152 is shown after being activated with a unit step activation signal. As is well known, the unit step signal transitions from an initial voltage level (typically zero volts) to a peak voltage level in a very short time period (on the order of a few microseconds). The abrupt change in voltage causes an abrupt change in position of the MEMS beams 152, which results in ringing of the MEMS beams as shown by the underdamped second order response shown in FIG. 7. As shown in the graph, the MEMS beams 152 are moved from an initial position to a peak position ($G_p$) in a peak time period ($t_p$) in response to the unit step activation signal. It is noted that the gap height of the MEMS beam 152 at the peak position ($G_p$) is greater than the gap height of the MEMS beam in the activated/desired position ($G_f$).

The MEMS beam 152 response of FIG. 7 is undesirable since the cavity resonator 100 is unprepared to intensify an input electromagnetic signal until the MEMS beams have "settled" at the desired gap height ($G_f$). The settling time ($t_s$) in FIG. 7 is approximately 1.2 milliseconds.

Figure 8:
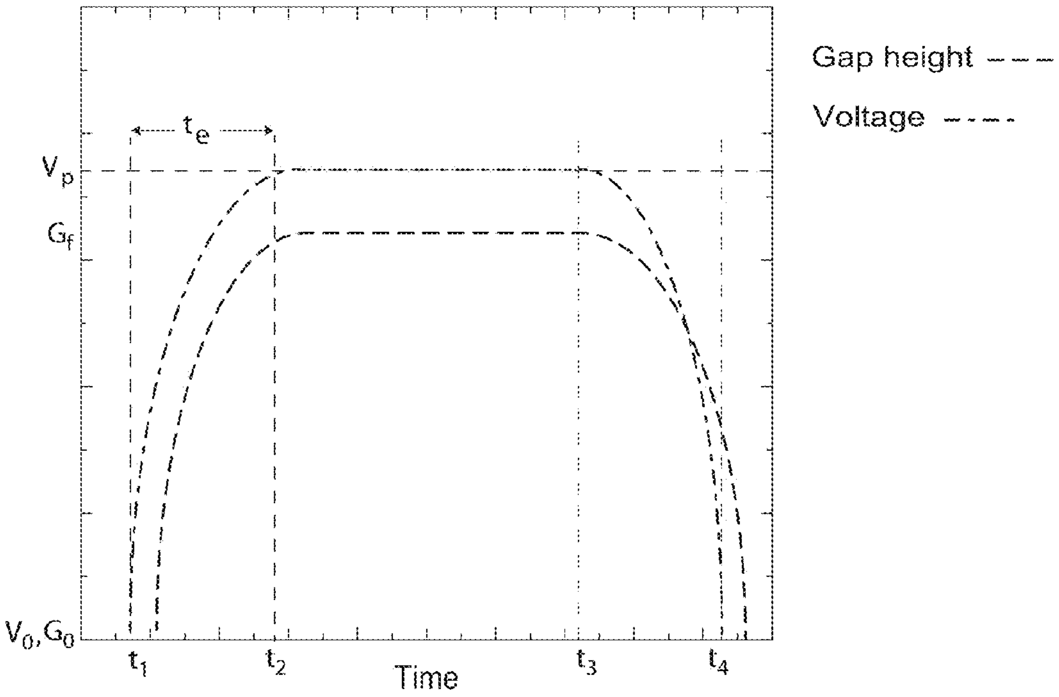
FIG. 8 is a graph showing a position of one of the MEMS beams of the cavity resonator of FIG. 1 and a dynamic DC activation signal configured to activate the MEMS beam.

As shown in FIG. 8, instead of being activated with the unit step activation signal, the DC biasing network 148 generates a dynamic DC activation signal that minimizes the settling time ($t_s$) and the "ringing" of the MEMS beams 152. The dynamic DC activation signal includes a rise time portion ($t_e$) (from $t_1$ to $t_2$), a steady state portion (from $t_2$ to $t_3$), and a fall time portion ($t_3$ to $t_4$). During the rise time portion ($t_e$) the voltage magnitude of the dynamic DC activation signal is changed from an initial value ($V_0$ as shown in FIG. 8, but in other embodiments the initial value is any other voltage magnitude) to a peak value ($V_p$). The rise time portion is started in response to the generation of the dynamic DC activation signal and ends in response to the dynamic DC activation signal having the peak value ($V_p$). In this regard, the dynamic DC activation signal is similar to the unit step input; however, instead of transitioning in a few microseconds, the dynamic DC activation signal transition from the initial value ($V_0$) to the peak value ($V_p$) in tens of microseconds. Accordingly, the duration of the rise time period is greater than the duration of the peak time period ($t_p$). In one embodiment, the duration of the rise time period is approximately sixty microseconds.

During the rise time portion the voltage waveform exhibits a nonlinear transition from the initial value to the peak value. In particular, the voltage waveform exhibits a rate of change that decreases with time during the rise time portion, unlike the unit step function which has a constant (theoretically infinite) rate of change from the initial value to the peak value. In this way, during the rise time portion the dynamic DC activation signal exhibits a controlled delay of a greater duration than any inherent delay present in the unit step function. The inherent delay in the unit step function refers to the delay in switching from the initial value to the peak value that is observed in a unit step function generated by an electronic device (i.e. a "real-world" unit step function signal).

During the steady state portion of the dynamic DC activation signal, the magnitude of the signal is maintained at the peak value ($V_p$).

The fall time portion begins at the end of the steady state portion when deactivation or repositioning of the MEMS beam 152 is desired. During the fall time portion the voltage magnitude of the dynamic DC activation signal is gradually decreased from the peak value ($V_p$) to the initial value ($V_0$). The duration of the fall time period is greater than the duration of the peak time period ($t_p$) and is approximately the same duration as the rise time period.

During the fall time portion, the waveform exhibits the same controlled delay as during the rise time portion. During the fall time portion, however, the rate of change increases with time.

The duration of the rise time portion ($t_e$) is determined based on the following expressions. First, a mechanical quality factor ($Q_m$) of the fixed-fixed MEMS beams 152 is determined according to expression (1). The mechanical quality factor ($Q_m$) is a relationship based on the energy stored in a resonator to the energy loss per cycle of the resonator. Accordingly, a high quality factor is associated with a resonator that is under-damped. For the MEMS beams 152 the mechanical quality factor is approximated by the following expression:

$$Q_m = \frac{\sqrt{E\rho t_b^2}}{\mu\left(\frac{\omega_b L_b}{2}\right)^2} g_{dc}^3 \tag{1}$$

In the above expression (1), E is the Young's modulus of the material forming the MEMS beam 152 and ρ is the density of the material forming the MEMS beams. The variable $t_b$ is the thickness 152*d* (FIG. 4) of the MEMS beams 152. The variable μ is a coefficient of viscosity of the material (typically air) through which the central portion 152*c* of the beam 152 is movable. At standard atmospheric temperature and pressure, μ is calculated to be approximately 1.845×10−5 kg/m·s. The variable $\omega_b$ is the width 152*f* of the central portion 152*c* of the MEMS beam 152 and the variable $L_b$ is the length of the central portion 152*c* of the MEMS beam 152. The variable $g_{dc}$ is the gap between the central portion 152*c* of the MEMS beam 152 and the nearest damping surface, such as the substrate 104. An exemplary value of $g_{dc}$ is approximately four micrometers.

After determining the mechanical quality factor ($Q_m$) of the MEMS beams 152, the duration of the peak time portion ($t_p$) is determined by the following expression:

$$t_p = \frac{\pi}{\omega_{m0}\sqrt{1-\left(\frac{1}{2Q_m}\right)^2}} \tag{2}$$

In the above expression (2), $\omega_{m0}$ is the mechanical resonate frequency of the MEMS beams 152 expressed in radians per second.

Next, the duration of the peak time period ($t_p$) is used to calculate the duration of the rise time period ($t_e$) according to the following expression:

$$t_e \geq 2.5 t_p \tag{3}$$

Accordingly, based on the second order response of the MEMS beams 152, the duration of the rise time period ($t_e$) that minimize ringing and minimizes the settling time is greater than or equal to 2.5 times the duration of the peak time period ($t_p$). As described above, the duration of the fall time period is approximately the same duration as the rise time period ($t_e$).

FIG. 8 shows the position response of one of the MEMS beams 152 to the dynamic DC activation signal having a rise time period ($t_e$) with a duration that at least 2.5 times the duration of the peak time period ($t_p$). During the rise time portion the position of the MEMS beam 152 moves from the initial position ($G_0$) to the desired position ($G_f$). During the steady state portion the MEMS beam 152 stays at the desired position ($G_f$). During the fall time portion the position of the MEMS beam 152 moves from the desired position ($G_f$) to the initial position ($G_0$).

Figure 9:
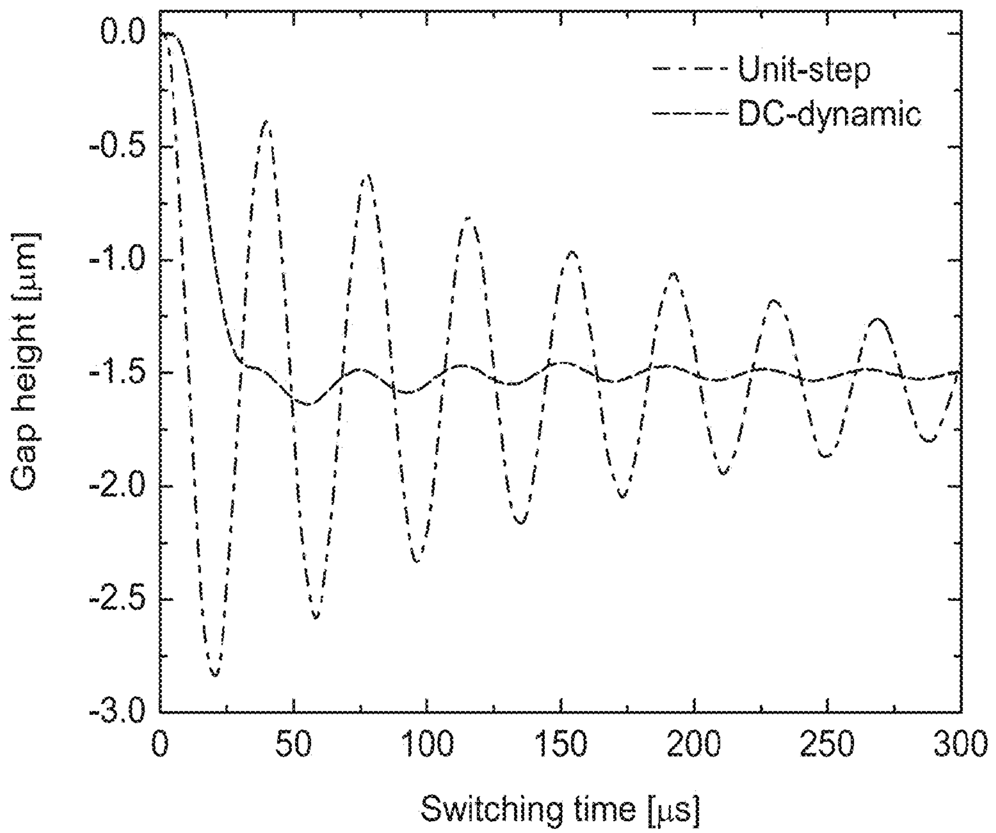
FIG. 9 is a graph showing the position of one of the MEMS beams of the cavity resonator of FIG. 1 verses time for a unit-step activation signal and the dynamic DC activation signal of FIG. 8.

With reference to FIG. 9, extending the duration of the rise time portion and the fall time portion to a time period that is greater than the peak time period ($t_p$), greatly reduces ringing of the MEMS beams 152 and causes the MEMS beams to smoothly and gradually arrive at the desired gap height ($G_f$). Accordingly, the dynamic DC activation signal results in a reduced settling time ($t_s$) and makes the switching time of the MEMS beams 152 much faster than is achieved with the unit-step activation signal.

Figure 10:
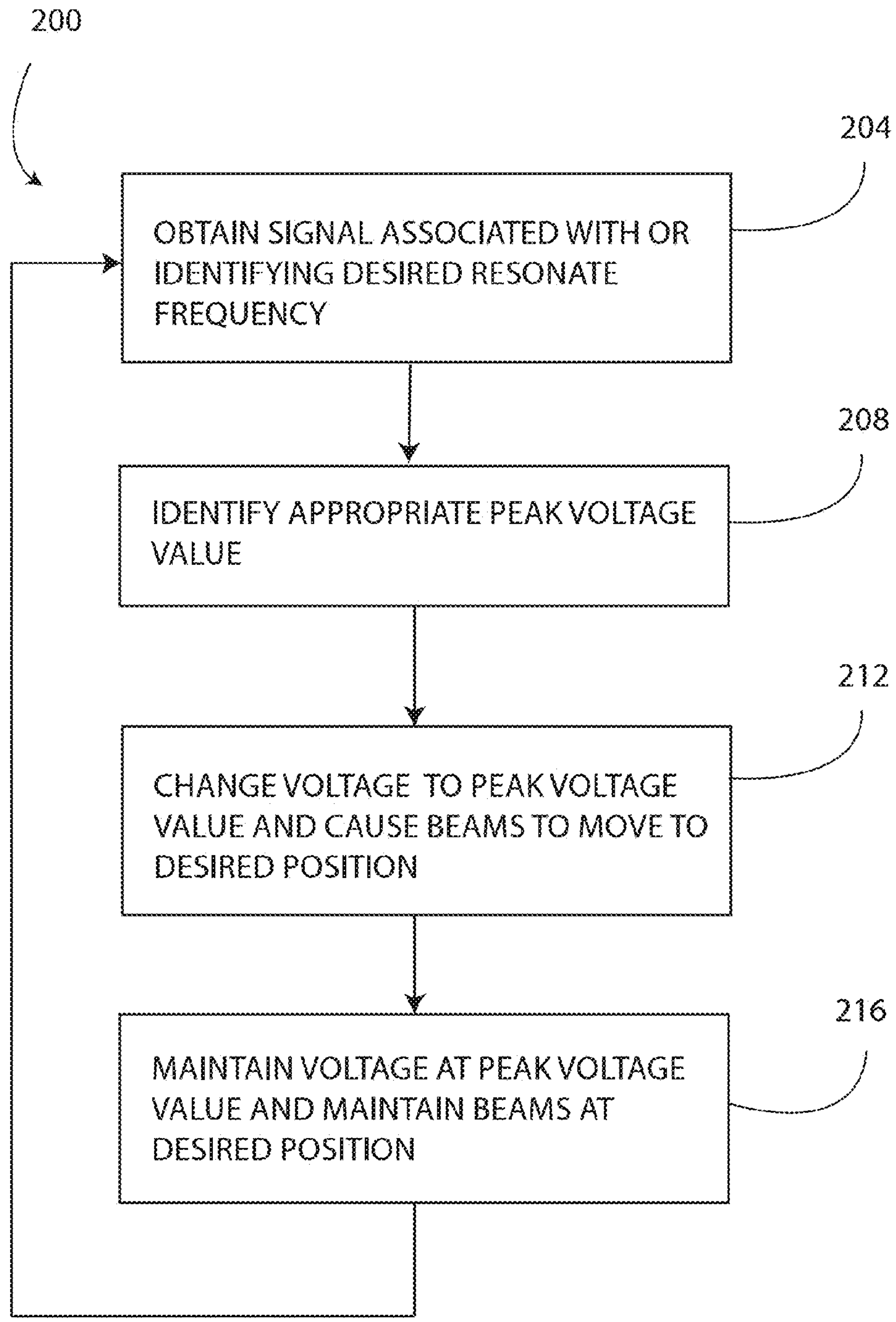
FIG. 10 is a flowchart depicting a method of operating the cavity resonator of FIG. 1.

As shown in FIG. 10, a flowchart depicts a method 200 of tuning the cavity resonator 100 of FIG. 1 using the dynamic DC activation signal shown in FIG. 8. First in block 204, a signal is obtained that is associated with or that identifies a desired resonate frequency of the cavity resonator 100. The signal is typically obtained by a system (not shown) with which the cavity resonator 100 is associated. The desired resonate frequency corresponds, for example, to a particular wireless circuit that is to be activated within a system, such as a mobile device. Typically, the desired resonate frequency is based on characteristics of an input signal to be filtered by the cavity resonator 100.

Next in block 208, a peak voltage ($V_p$) of the dynamic DC activation signal is selected. The peak voltage ($V_p$) causes the MEMS beams 152 to move to an activated position (a particular "gap height") that causes the resonate frequency of the cavity resonator 100 to be the desired resonate frequency.

Next, as shown in block 212, the dynamic DC activation signal is generated and the magnitude of the signal is changed from a current value (e.g. the initial value ($V_0$)) to the peak voltage ($V_p$) according to the rise time portion of the waveform shown in FIG. 8. In particular, a rise time period ($t_e$) is selected that is at least 2.5 times the duration of the peak time period and a waveform is generated that at least approximates the waveform of FIG. 8. The DC voltage electrostatically activates the MEMS beams 152 and causes the MEMS beams to move to the activated position that generates the desired resonate frequency.

Next, as shown in block 216, the DC voltage of the DC activation signal is maintained at the peak voltage until a different resonate frequency is identified or until use of the cavity resonator 100 is unneeded. If a different resonate frequency (having a different peak voltage ($V_p$) associated therewith) is identified, the magnitude of the DC activation signal is gradually changed to the new peak voltage according to the rise time portion or the fall time portion of the waveform of FIG. 8. The new peak voltage causes the MEMS beams 152 to move to a different activated position (a different gap height) and changes the resonate frequency of the cavity resonator 100.

If the cavity resonator 100 is no longer needed the magnitude of the dynamic DC activation signal is gradually transitioned to the initial value ($V_0$) (typically zero volts) according to the fall time portion of the waveform of FIG. 8. A duration of the fall time period is selected that is at least 2.5 times the duration of the peak time period. If the magnitude of the DC activation signal is transitioned to zero volts, then the MEMS beams 152 move to the deactivated position.

Figure 11:
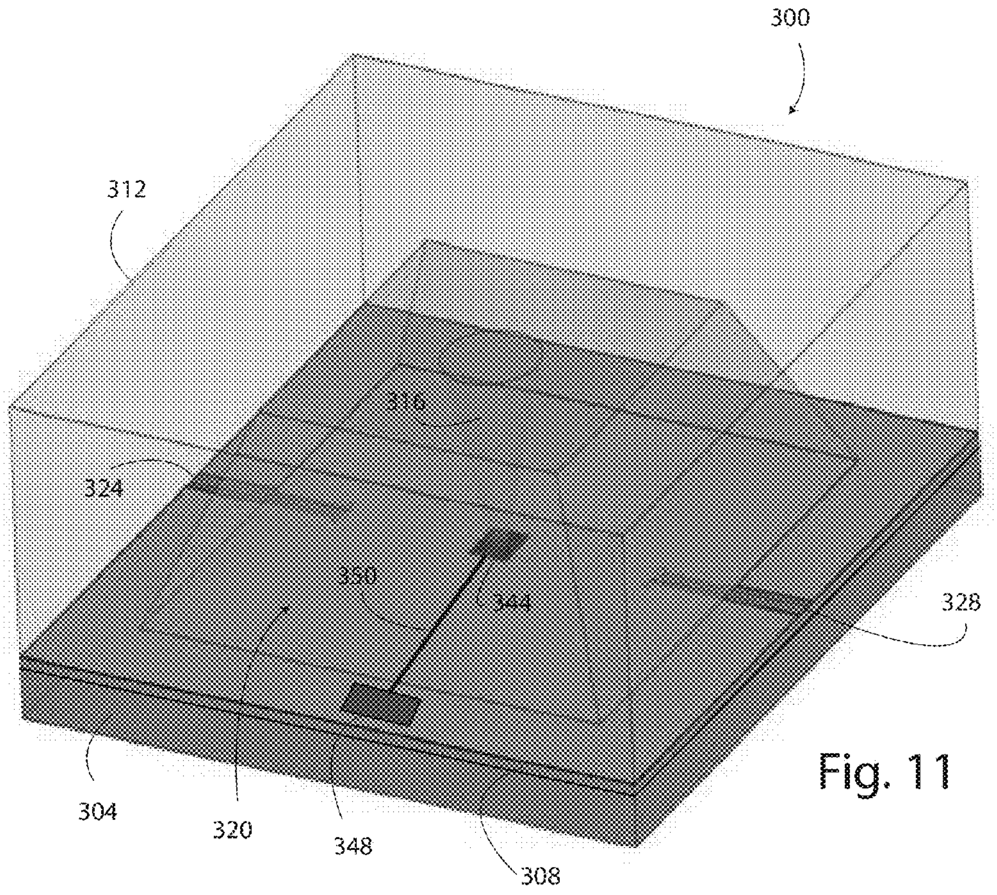
FIG. 11 is a perspective view of another embodiment of a tunable cavity resonator.
Figure 12:
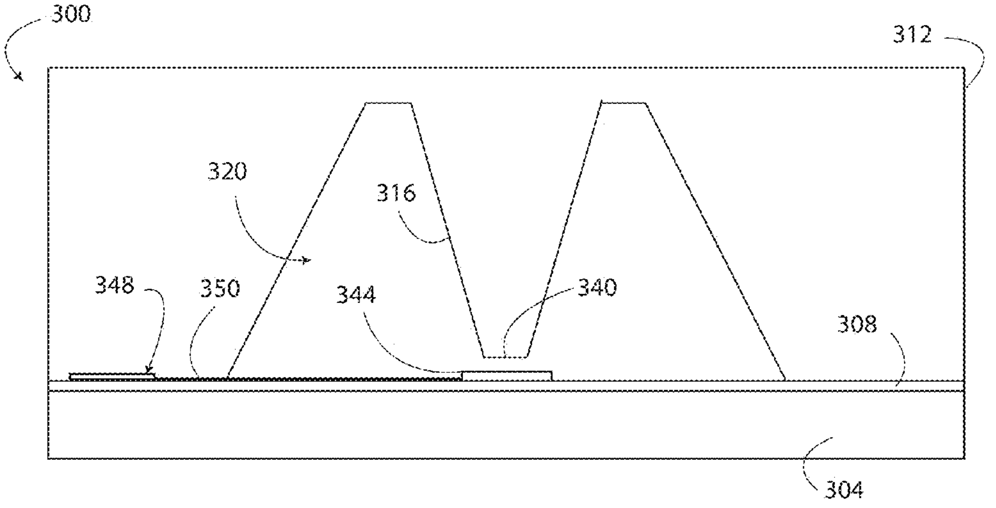
FIG. 12 is a cross sectional view of the cavity resonator of FIG. 11.

As shown in FIGS. 11 and 12 another embodiment of a cavity resonator 300 includes a substrate 304, an insulating structure 308, and a cap structure 312. The substrate 304 is formed from high resistivity silicon.

The insulating structure 308 is formed on the substrate 304 and is positioned between the substrate and the cap structure 312. The insulating structure 308 is formed from thermally grown silicon dioxide.

The cap structure 312 extends from the substrate 304 and the insulating structure 308. The cap structure 312 is also formed from silicon. The cap structure 312 defines an evanescent post 316 and a resonator cavity 320 in which an input lead 324 and an output lead 328 are positioned.

The cavity resonator 300 further includes a tuning assembly 344, a DC biasing network 348, and a DC biasline 350. The tuning assembly 344 is at least partially positioned within the resonator cavity 320 and includes numerous fixed-fixed MEMS beams 352 and an actuator assembly 356 (FIG. 13).

Figure 13:
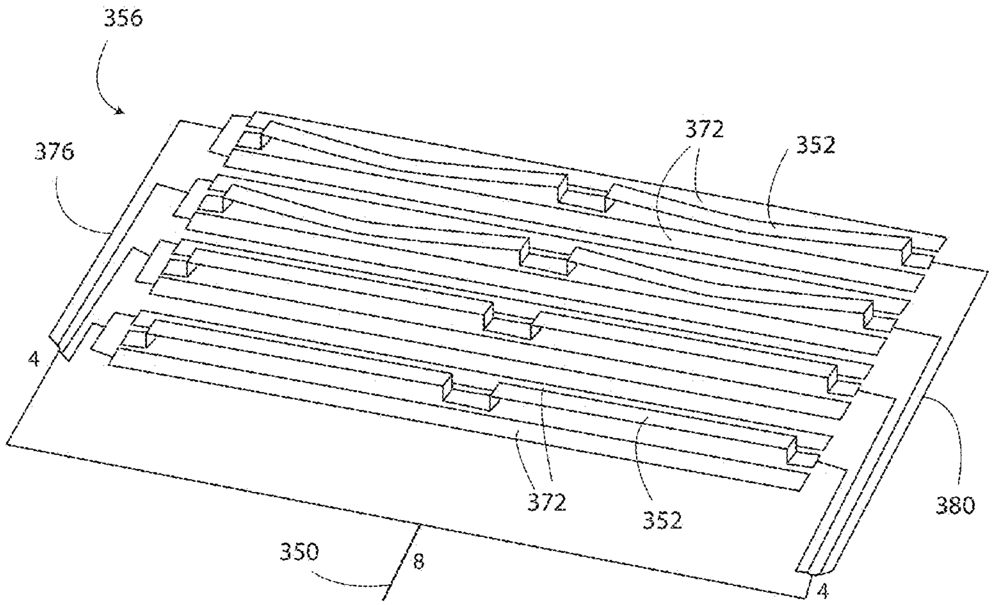
FIG. 13 is a perspective view of an array of fixed-fixed MEMS beams of the cavity resonator of FIG. 11.
Figure 14:
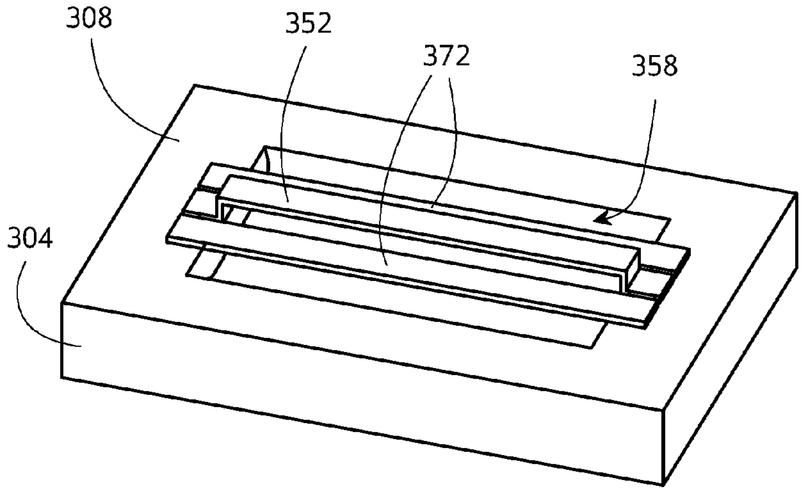
FIG. 14 is a perspective view of a portion of a substrate and one of the fixed-fixed MEMS beams of the cavity resonator of FIG. 11.

As shown in FIG. 13, the MEMS beams 352 are positioned in a rectangular array on top of the insulating structure 308. Only eight of the approximately seventy-five of the MEMS beams 352 are shown. The MEMS beams 352 may suitably have the same structure as the MEMS beam 152 shown in FIG. 4. With reference to FIG. 14, the MEMS beams 352 are formed from gold (see gold layer 174, FIG. 6D) deposited onto the insulating structure 308 and are positioned above a cavity 358 defined in the substrate 304.

The MEMS beams 352 are configured for controllable movement between a deactivated position (lower four MEMS beams in FIG. 13) and an activated position (upper four MEMS beams in FIG. 14) in order to tune a resonate frequency of the cavity resonator 300. In the activated position the MEMS beams 352 are biased toward the substrate 304 and the insulating structure 308, but do not contact the substrate or the insulating structure.

Figure 15:
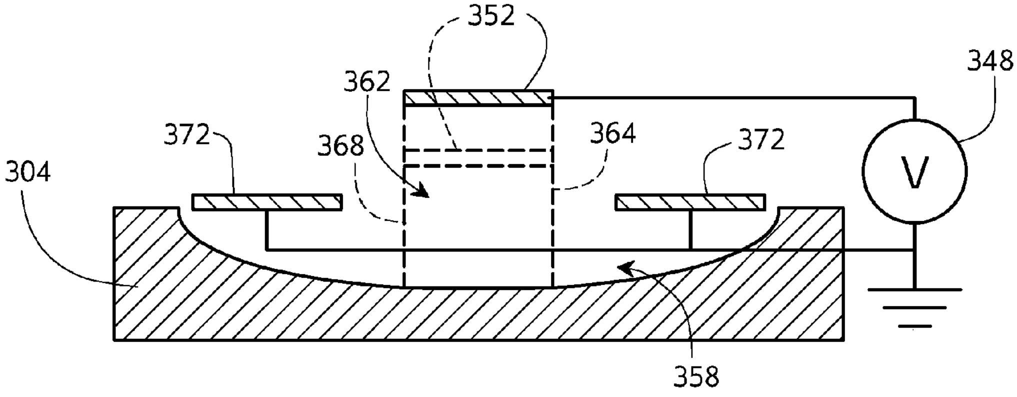
FIG. 15 is a cross sectional view of a portion of the substrate and one of the fixed-fixed MEMS beams of the cavity resonator of FIG. 11.

As shown in FIG. 15, a space 362 is defined between the MEMS beams 352 and the substrate 304. Specifically, the space 362 is defined by the MEMS beam 352, by the substrate 304, by a boundary 364 that extends between the MEMS beam and the substrate, and by another boundary 368 that extends between the MEMS beam and the substrate. Accordingly, the space 362 is approximately a rectangular void.

The actuator assembly 356 is configured to controllably cause movement the MEMS beams 352. As shown in FIG. 13, the actuator assembly 356 includes a plurality of electrodes 372 spaced apart from the substrate 304. Each MEMS beam 352 is controlled by the two electrodes 372 adjacent thereto. The electrodes 372 are formed from the same material as the MEMS beams 352 and are substantially parallel to the MEMS beams.

With reference to FIG. 15, the electrodes 372 are spaced apart from the substrate 304 and the MEMS beams 352. Also, the electrodes 372 are laterally spaced apart from the spaces 362. Therefore, the electrodes 372 are positioned such that the MEMS beams 352 are spaced apart from electrodes when the MEMS beams are in the deactivated position (solid lines in FIG. 15) and the activated position (broken lines in FIG. 15). As a result, the activation method of the actuator assembly 356 is a fringe-field electrostatic activation as opposed to direct-field electrostatic activation.

Referring again to FIG. 11, the DC biasing network 348 is electrically coupled to the tuning assembly 344 by the DC biasline 350. The DC biasing network 348 is spaced apart from the resonator cavity 320 so that the DC biasing network does not electrically interfere with the electrical characteristic of the cavity resonator 300. The DC biasing network 348 is configured to generate an activation signal (such as the dynamic DC activation signal) that causes controlled movement of the MEMS beams 352.

As shown in FIG. 13, the DC biasline 350 includes numerous electrically isolated conducting paths 376, 380. Some of the conducting paths 376 electrically couple the DC biasing network 348 to the electrodes 372. Other conducting paths 380 electrically couple the DC biasing network 348 to the MEMS beams 352. Since the conducting paths 376, 380 are electrically isolated, the DC biasing network 348 is configurable to activate some of the MEMS beams 352 with the activation signal while leaving other MEMS beams in the deactivated state. In this way, the DC biasing network 348 is configured to "fine tune" the resonate frequency of the cavity resonator 300 by using only a subset of the MEMS beams to tune the cavity resonator 300.

Figure 16:
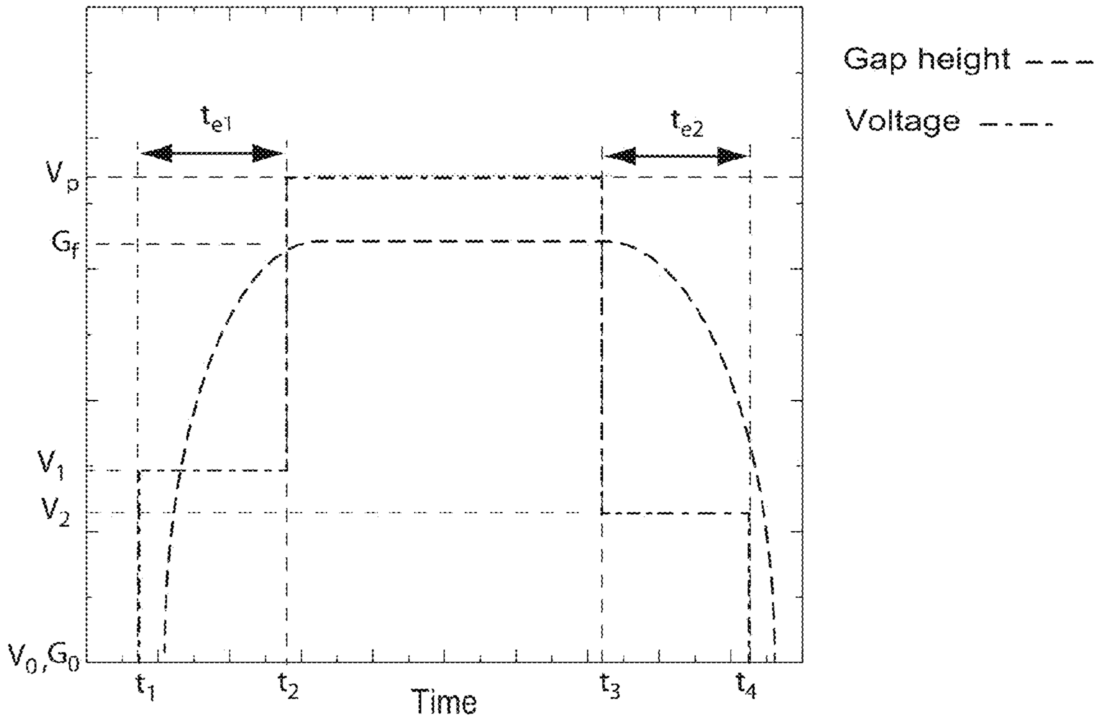
FIG. 16 is a graph showing a position of one of the MEMS beams of the cavity resonator of FIG. 11 and a dynamic DC activation signal configured to activate the MEMS beam.

As shown in FIG. 16, the DC biasing network 348 generates a dynamic DC activation signal that minimizes the settling time ($t_s$) (FIG. 7) and the "ringing" of at least one of the MEMS beams 352. The dynamic DC activation signal includes a rise time portion (t1 to t2), a steady state portion (t2 to t3), and a fall time portion (t3 to t4). The rise time portion is initiated when activation of the MEMS beams 352 is desired. During the rise time portion the voltage magnitude of the dynamic DC activation signal is increased from an initial value ($V_0$), to an intermediate value ($V_1$), and then to a peak value ($V_p$). The rise time portion is started in response to the generation of the dynamic DC activation signal and ends in response to the dynamic DC activation signal having the peak value ($V_p$). The dynamic DC activation signal is maintained at the intermediate value ($V_1$) for a predetermined time period ($t_{e1}$). In one embodiment, the duration of the rise time period and the predetermined time period ($t_{e1}$) are both approximately sixty microseconds.

During the steady state portion of the dynamic DC activation signal, the magnitude of the signal is maintained at the peak value ($V_0$).

The fall time portion begins at the end of the steady state portion when deactivation of the MEMS beams 352 is desired. During the fall time portion the voltage magnitude of the dynamic DC activation signal is decreased from the peak value ($V_p$), to a second intermediate value ($V_2$), and then to the initial value ($V_0$). The dynamic DC activation signal is maintained at the intermediate value ($V_2$) for a predetermined time period ($t_{e2}$). In one embodiment, the duration of the fall time period and the predetermined time period ($t_{e2}$) is approximately sixty microseconds.

Figure 17:
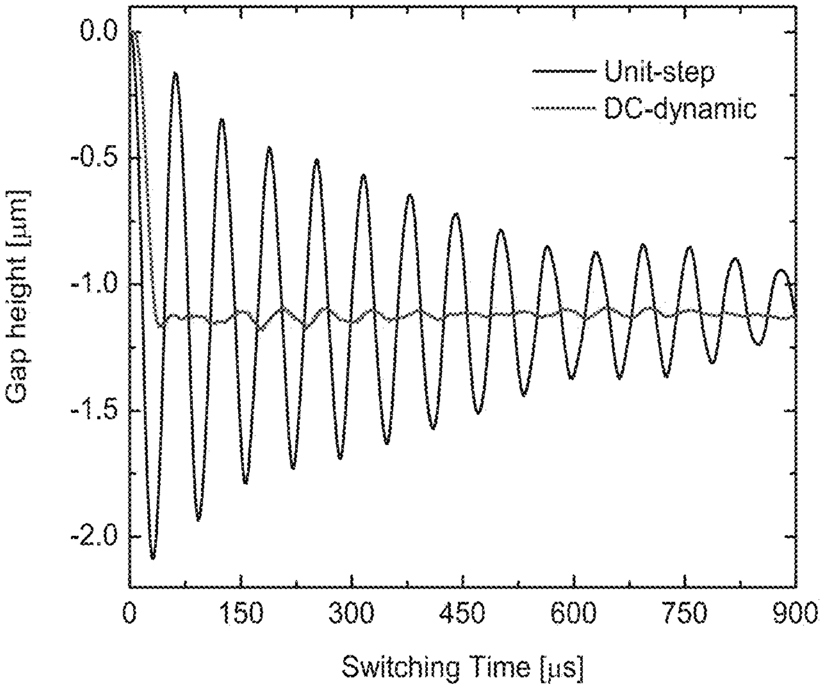
FIG. 17 is a graph showing the position of one of the MEMS beams of the cavity resonator of FIG. 11 verses time for a unit-step activation signal and the dynamic DC activation signal of FIG. 16.
Figure 18:
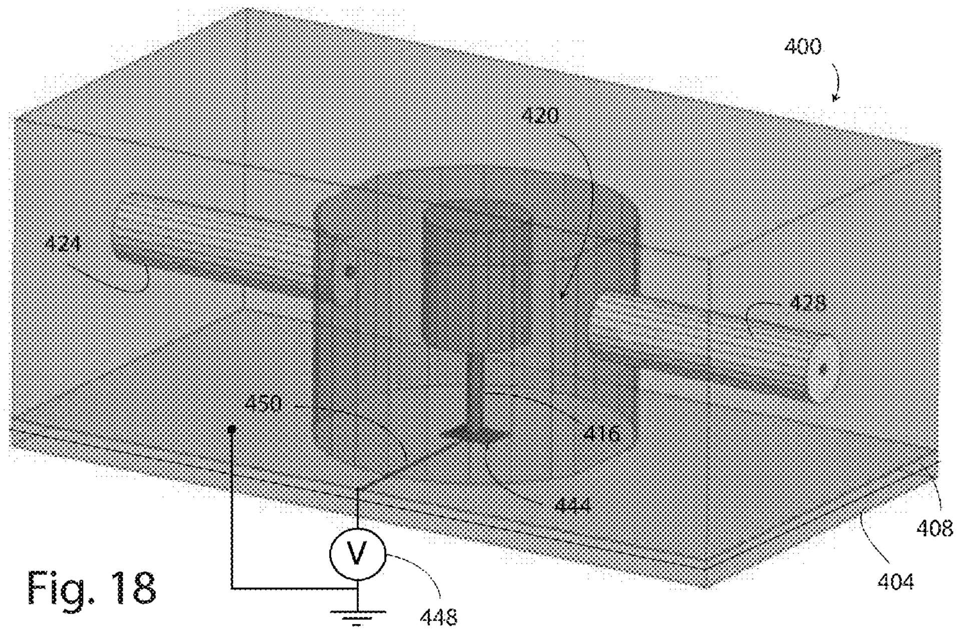
FIG. 18 is a perspective view of another embodiment of a tunable cavity resonator.
Figure 19:
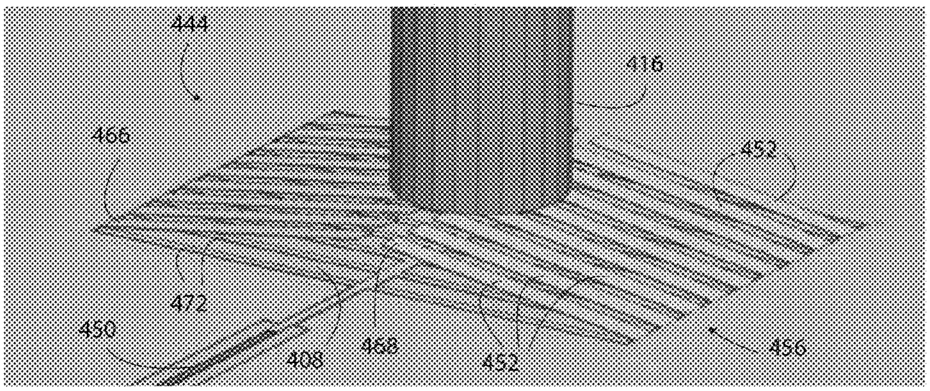
FIG. 19 is a perspective view of a portion of the cavity resonator of FIG. 18 showing numerous cantilever MEMS beams.

In response to a unit step activation signal the MEMS beams 352 exhibit the under-damped second order response shown in FIG. 7, in which the MEMS beams move from an initial position ($G_0$) to a peak position ($G_p$) in a peak time period ($t_p$). In the dynamic DC activation signal of FIG. 16, the duration of the rise time portion and the duration of the fall time portion are both longer than the duration of the peak time period ($t_p$) to minimize ringing of the MEMS beams 352 and to minimize the settling time ($t_s$) of the MEMS beams, as shown by the beam response (i.e. the gap height) in FIGS. 16 and 17. Specifically, the MEMS beams 352 smoothly arrive at the desired gap height ($G_f$) in response to the dynamic DC activation signal of FIG. 16, As shown in FIGS. 18 and 19 another embodiment of a cavity resonator 400 includes a substrate 404, an insulating structure 408, and a cap structure 412. The substrate 404 and the cap structure 412 are formed from high resistivity silicon. The insulating structure 408 is formed from thermally grown silicon dioxide.

The cap structure 412 defines an approximately cylindrical evanescent post 416 and a resonator cavity 420 in which an input lead 424 and an output lead 428 are positioned. The resonator cavity 420 is an approximately cylindrical cavity. The resonator cavity 420, in other embodiments, is at least partially defined by the substrate 404.

The cavity resonator 400 further includes a tuning assembly 444, a DC biasing network 448, and a DC biasline 450. The tuning assembly 444 is at least partially positioned within the resonator cavity 420 and includes numerous cantilever MEMS beams 452 and an actuator assembly 456.

As shown in FIG. 19, the MEMS beams 452 are positioned in a rectangular array on top of the insulating structure 408. The MEMS beams 452 are formed from a layer of gold deposited onto the insulating structure 408. A fixed end 466 of the MEMS beams 452 is connected to the insulating structure 408 and a free end 468 of the MEMS beams is configured for movement relative to the substrate. The free ends 468 of the MEMS beams 452 are positioned between and spaced apart from the evanescent post 416 and the substrate 404.

The MEMS beams 452 are configured for controllable movement between a deactivated position and an activated position in order to tune a resonate frequency of the cavity resonator 400. In the activated position the MEMS beams 452 are biased toward the substrate 404, but do not contact the substrate. In the deactivated position, the MEMS beams 452 controllably "spring" back to the position shown in FIG. 19.

The actuator assembly 456 is configured to controllably cause movement the MEMS beams 452. As shown in FIG. 19, the actuator assembly 456 includes a plurality of electrodes 472. Each MEMS beam 452 is controlled by the two electrodes 472 adjacent thereto. The electrodes 472 are formed from the same material as the MEMS beams 452 and are substantially parallel to the MEMS beams.

The electrodes 472 are laterally spaced apart from the MEMS beams 452. As a result, the activation method of the actuator assembly 456 is a fringe-field electrostatic activation as opposed to direct-field electrostatic activation.

The DC biasing network 448 and the DC biasline 450 are substantially equivalent to the DC biasing network 348 and the DC biasline 350 of the cavity resonator 300 shown in FIG. 11.

Figure 20:
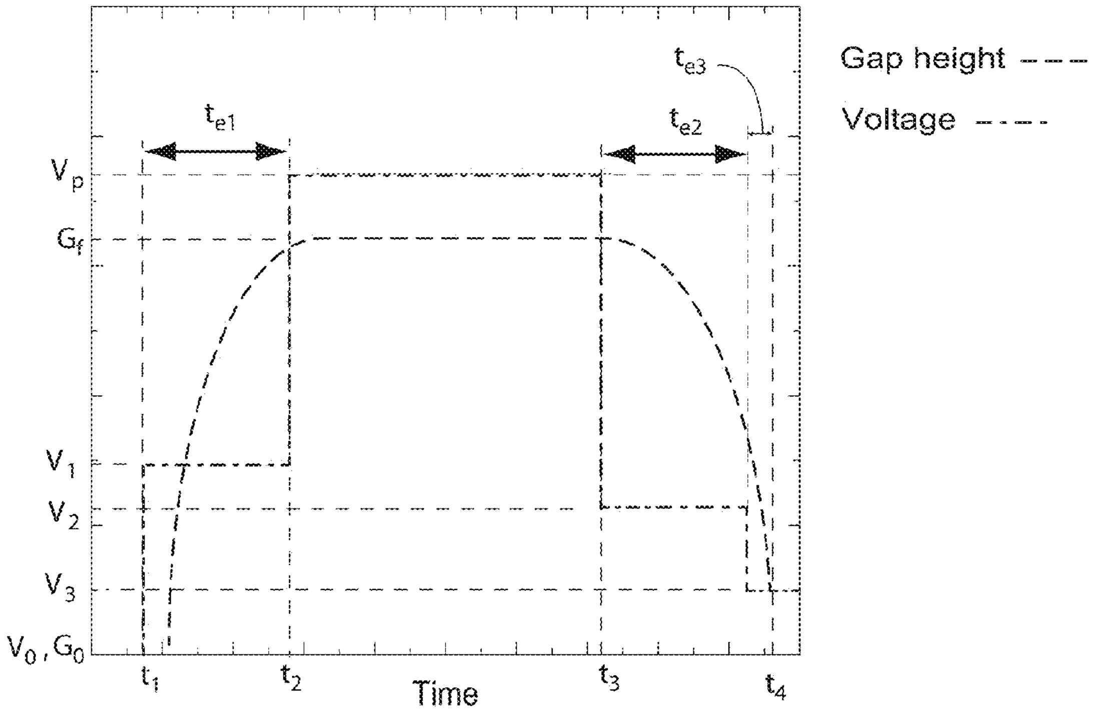
FIG. 20 is a graph showing a position of one of the MEMS beams of the cavity resonator of FIG. 18 and a dynamic DC activation signal configured to activate the MEMS beam.

As shown in FIG. 20, the DC biasing network 448 is configured to generate a dynamic DC activation signal that is particularly suited for controllably moving the MEMS beams 452 while minimizing ringing and the settling time ($t_s$) of the MEMS beams. The dynamic DC activation signal includes a rise time portion ($t_1$ to $t_2$), a steady state portion ($t_2$ to $t_3$), and a fall time portion ($t_3$ to $t_4$). The rise time portion is initiated when activation of the MEMS beams 452 is desired. During the rise time portion the voltage magnitude of the dynamic DC activation signal is increased from an initial value ($V_0$), to an intermediate value ($V_1$), and then to a peak value ($V_p$). The rise time portion is started in response to the generation of the dynamic DC activation signal and ends in response to the dynamic DC activation signal having the peak value. The dynamic DC activation signal is maintained at the intermediate value ($V_1$) for a predetermined time period ($t_{e1}$). In one embodiment, the duration of the rise time period and the predetermined time period ($t_{e1}$) are both approximately sixty microseconds.

During the steady state portion of the dynamic DC activation signal, the magnitude of the signal is maintained at the peak value ($V_p$).

The fall time portion begins at the end of the steady state portion when deactivation of the MEMS beams 452 is desired. During the fall time portion the voltage magnitude of the dynamic DC activation signal is decreased from the peak value, to a second intermediate value ($V_2$), and to a third intermediate value ($V_3$) having a magnitude that is greater than the magnitude of the initial value ($V_0$) and less than the magnitude of the second intermediate value. The dynamic DC activation signal is maintained at the second intermediate value ($V_2$) for the predetermined time period ($t_{e2}$). The dynamic DC activation signal is maintained at the third intermediate value ($V_3$) for another predetermined time period ($t_{e3}$) that is less than the predetermined time period ($t_{e2}$). In one embodiment, the duration of the fall time period is approximately sixty microseconds and the fall time period ends in response to the dynamic DC activation signal having the third intermediate value ($V_3$) for the predetermined time period ($t_{e3}$). In another embodiment, the magnitude of the third intermediate value ($V_3$) is substantially equal to the magnitude of the initial value ($V_0$).

Figure 21:
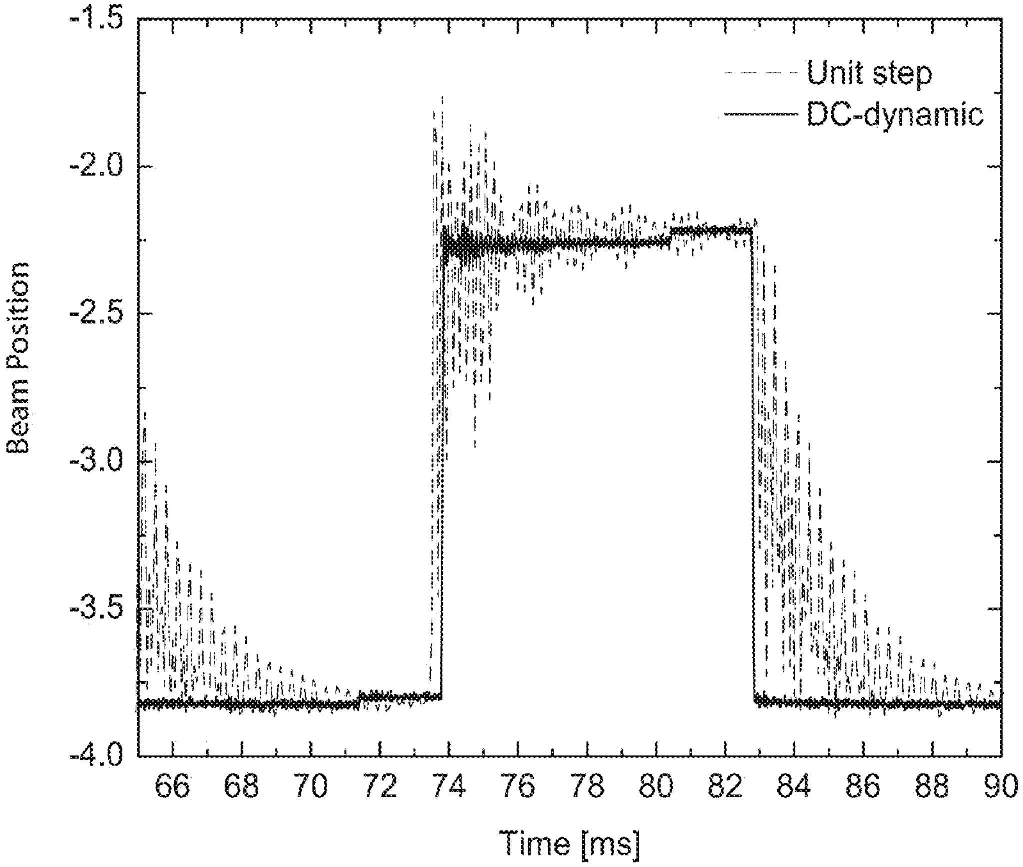
FIG. 21 is a graph showing the position of one of the MEMS beams of the cavity resonator of FIG. 18 verses time for a unit-step activation signal and the dynamic DC activation signal of FIG. 20.

As shown in FIG. 21, in response to a unit step input the MEMS beams 452 exhibit the under-damped second order response. In the dynamic DC activation signal, the duration of the rise time portion and the duration of the fall time portion are both longer than the duration of the peak time period ($t_p$) to minimize ringing of the MEMS beams 452 and to minimize the settling time ($t_s$) of the MEMS beams, as shown by the beam response (i.e. the gap height) in FIGS. 20 and 21.

What is claimed is:

1. A tunable cavity resonator comprising:

a substrate;

a cap structure extending from the substrate, at least one of the substrate and the cap structure defining a resonator cavity; and a tuning assembly positioned at least partially within the resonator cavity, the tuning assembly including a plurality of fixed-fixed MEMS beams configured for controllable movement relative to the substrate between an activated position and a deactivated position in order to tune a resonant frequency of the tunable cavity resonator.

2. The tunable cavity resonator of claim 1, wherein:

the tuning assembly includes an actuator assembly, and the actuator assembly is configured to controllably cause movement of at least one fixed-fixed MEMS beam of the plurality of fixed-fixed MEMS beams.

3. The tunable cavity resonator of claim 2, wherein the actuator assembly includes a plurality of electrodes spaced apart from the substrate.

4. The tunable cavity resonator of claim 3, wherein:

a plurality of spaces is defined between each fixed-fixed MEMS beam of the plurality of fixed-fixed MEMS beams and the substrate, each electrode of the plurality of electrodes is laterally spaced apart from the plurality of spaces, and the plurality of fixed-fixed MEMS beams are spaced apart from the plurality of electrodes in the activated position and the deactivated position.

5. The tunable cavity resonator of claim 2, further comprising:

a DC biasing network spaced apart from the resonator cavity; and a DC biasline located partially within the resonator cavity and electrically coupled to the tuning assembly and to the DC biasing network.

6. The tunable cavity resonator of claim 5, wherein:

the DC biasline includes a first plurality of electrically isolated conducting paths and a second plurality of electrically isolated conducting paths, each electrically isolated conducting path of the first plurality of electrically isolated conducting paths is electrically coupled to at least one of the electrodes of the plurality of electrodes, and each electrically isolated conducting path of the second plurality of electrically isolated conducting paths is electrically coupled to at least one of the fixed-fixed MEMS beams of the plurality of fixed-fixed MEMS beams.

7. The tunable cavity resonator of claim 5, further comprising:

an insulating structure positioned between (i) the substrate and the tuning assembly, (ii) the substrate and the cap structure, and (iii) the substrate and the DC biasline, and wherein the fixed-fixed MEMS beams of the plurality of fixed-fixed MEMS beams are biased toward the insulating structure in the activated position.

8. The tunable cavity resonator of claim 4, wherein:

the DC biasing network is configured to generate a dynamic activation signal for activating at least one fixed-fixed MEMS beam of the plurality of fixed-fixed MEMS beams, in response to a unit step activation signal the at least one fixed-fixed MEMS beam is moved from an initial position to a peak position in a peak time period, the dynamic activation signal includes a rise time portion in which a magnitude of the activation signal is increased from an initial value to a peak value, the rise time portion is started in response to the generation of the dynamic activation signal and ends in response to the dynamic activation signal having the peak value, and a duration of the rise time portion is greater than a duration of the peak time period.

9. The tunable cavity resonator of claim 1, wherein the plurality of fixed-fixed MEMS beams is positioned in a rectangular array.

10. The tunable cavity resonator of claim 1, wherein:

the substrate is formed from silicon, and the cap structure is formed from silicon.

11. A tunable cavity resonator comprising:

a substrate;

a cap structure extending from the substrate, at least one of the substrate and the cap structure defining a resonator cavity;

a tuning assembly positioned at least partially within the resonator cavity, the tuning assembly including a plurality of fixed-fixed MEMS beams configured for controllable movement relative to the substrate and a plurality of actuators, each actuator of the plurality of actuators being configured to controllably cause movement of one of the fixed-fixed MEMS beams of the plurality of fixed-fixed MEMS beams;

a DC biasing network configured to generate a dynamic activation signal for activating at least one fixed-fixed MEMS beam of the plurality of fixed-fixed MEMS beams, wherein in response to a unit step activation signal the at least one fixed-fixed MEMS beam is moved from an initial position to a peak position in a peak time period, wherein the dynamic activation signal includes a rise time portion in which a magnitude of the activation signal is increased from an initial value, to a first intermediate value, and then to a peak value, wherein the rise time portion is started in response to the generation of the dynamic activation signal and ends in response to the dynamic activation signal having the peak value, wherein the dynamic activation signal is maintained at the first intermediate value for a first predetermined time period, wherein a duration of the rise time portion is greater than a duration of the peak time period, wherein a plurality of electrostatic spaces is defined between each fixed-fixed MEMS beam of the plurality of fixed-fixed MEMS beams and the substrate, and wherein each actuator of the plurality of actuators is spaced apart from the plurality of electrostatic spaces.

12. The tunable cavity resonator of claim 11, wherein a duration of the first predetermined time period is substantially equal to the duration of the rise time period.

13. The tunable cavity resonator of claim 11, further comprising:

a DC biasline located partially within the resonator cavity and electrically coupled to the tuning assembly and to the DC biasing network, wherein the DC biasing network is spaced apart from the resonator cavity.

14. The tunable cavity resonator of claim 11, wherein:

the dynamic activation signal includes a fall time portion in which the magnitude of the dynamic activation signal is decreased from the peak value, to a second intermediate value, and to a third intermediate value, wherein the fall time portion is started in response to the dynamic activation signal being decreased from the peak value and ends in response to the dynamic activation signal having the third intermediate value, and wherein a duration of the fall time portion is greater than a duration of the peak time period.

15. The tunable cavity resonator of claim 14, wherein:

the dynamic activation signal is maintained at the second intermediate value for a second predetermined time period, a duration of second predetermined time period is substantially equal to the duration of the fall time period.

16. The tunable cavity resonator of claim 15, wherein a magnitude of the third intermediate value is substantially equal to the initial value.

17. The tunable cavity resonator of claim 15, wherein a magnitude of the third intermediate value is greater than a magnitude of the initial value and is less than a magnitude of the second intermediate value.

18. A method of tuning a tunable cavity resonator including a plurality of MEMS beams and a DC biasing network electrically coupled to the plurality of MEMS beams and configured to generate a dynamic activation signal for controllably moving at least one of the MEMS beams between an activated position and an initial position, the method comprising:

increasing a voltage magnitude of the dynamic activation signal from an initial value to a peak value during a rise-time time period, the rise-time time period ending in response to the voltage magnitude being the peak value; and causing at least one MEMS beam to move from the initial position to the activated position in response to increasing the voltage magnitude of the dynamic activation signal, the at least one MEMS beam being in the activated position at the end of the rise-time time period, wherein in response to a unit step activation signal the at least one MEMS beam is moved from an initial position to a peak position in a peak time period, wherein a duration of the rise time portion is greater than a duration of the peak time period, and wherein a magnitude of the peak position is greater than a magnitude of the activated position.

19. The method of claim 17, further comprising:

decreasing a voltage magnitude of the dynamic activation signal from the peak value to the initial value during a fall-time time period, the fall-time time period ending in response to the voltage magnitude being the initial value; and causing the at least one MEMS beam to move from the activated position to the initial position in response to the decreasing the voltage magnitude of the dynamic activation signal, the at least one MEMS beam being in the initial position at the end of the rise-time time period, wherein a duration of the fall-time time portion is greater than a duration of the peak time period.

20. The method of claim 17, further comprising:

maintaining the voltage magnitude of the dynamic activation signal at a first intermediate value for a first predetermined time period during the rise-time time period; and maintaining the voltage magnitude of the dynamic activation signal at a second intermediate value for a second predetermined time period during the fall-time time period, wherein the first intermediate value is greater than the initial value and is less than the peak value, wherein the second intermediate value is greater than the initial value, is less than the peak value, and is less than the first intermediate value, wherein a duration of first predetermined time period is substantially equal to the duration of the rise-time time period, and wherein a duration of second predetermined time period is substantially equal to the duration of the fall-time time period.

* * * * *